(12) United States Patent
Choi et al.

(10) Patent No.: US 11,408,070 B2
(45) Date of Patent: Aug. 9, 2022

(54) WAFER PROCESSING APPARATUS AND WAFER PROCESSING METHOD

(71) Applicant: Samsung Electronics Co., Ltd., Suwon-si (KR)

(72) Inventors: Hyunho Choi, Yongin-si (KR); Junghoon Kim, Hwaseong-si (KR); Donghyouck Lee, Hwaseong-si (KR); Jaehyung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 16/894,811

(22) Filed: Jun. 7, 2020

(65) Prior Publication Data
US 2021/0123138 A1    Apr. 29, 2021

(30) Foreign Application Priority Data

Oct. 23, 2019 (KR) .......................... 10-2019-0131878

(51) Int. Cl.
*C23C 16/455* (2006.01)
*H01L 21/673* (2006.01)
*C23C 16/458* (2006.01)

(52) U.S. Cl.
CPC .... *C23C 16/45551* (2013.01); *C23C 16/4583* (2013.01); *C23C 16/45578* (2013.01); *H01L 21/67303* (2013.01)

(58) Field of Classification Search
CPC ................ H01L 21/67303; C23C 16/45551
See application file for complete search history.

(56) References Cited

U.S. PATENT DOCUMENTS

| 10,364,494 B2 | 7/2019 | Yoo et al. |
| 2001/0010256 A1* | 8/2001 | Nozawa ............... C23C 14/568 |
| | | 156/345.55 |
| 2018/0195172 A1 | 7/2018 | Tatsuoka et al. |
| 2019/0093230 A1 | 3/2019 | Fukushima |

FOREIGN PATENT DOCUMENTS

| JP | H05198517 A | 8/1993 |
| JP | 2012151386 A | 8/2012 |
| JP | 2015179725 A | 10/2015 |
| JP | 6294930 B2 | 3/2018 |
| JP | 2018-056232 * | 4/2018 |
| KR | 100302114 B1 | 6/2001 |
| KR | 20070076082 A | 7/2007 |
| KR | 101108576 B1 | 1/2012 |
| KR | 101453894 B1 | 10/2014 |
| KR | 101462259 B1 | 11/2014 |
| KR | 20190079028 A | 7/2019 |

* cited by examiner

*Primary Examiner* — Joseph A Miller, Jr.
(74) *Attorney, Agent, or Firm* — Muir Patent Law, PLLC

(57) ABSTRACT

A wafer processing apparatus includes a reaction tube extending in a vertical direction, a door plate configured to load a boat into the reaction tube and positioned under the reaction tube to seal the reaction tube, the boat supporting a plurality of wafers thereon, a gas injector extending in the vertical direction along the boat within the reaction tube and including a plurality of ejection holes formed therein, a rotary mechanism configured to rotate the gas injector about its center axis to adjust an angle of the ejection hole toward the wafer, and a lift mechanism configured to move the gas injector upward and downward to adjust a height of the ejection hole on the wafer.

15 Claims, 10 Drawing Sheets

10

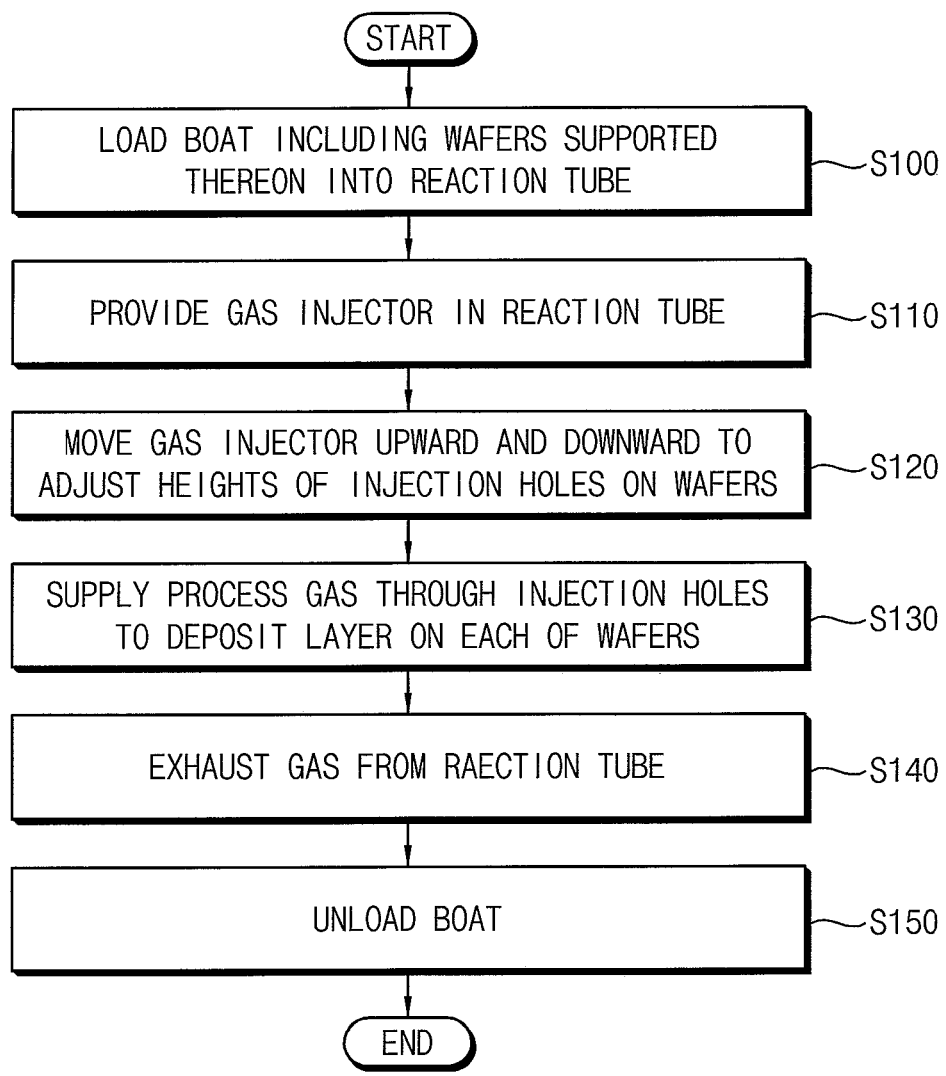

WAFER PROCESSING APPARATUS AND WAFER PROCESSING METHOD

PRIORITY STATEMENT

This application claims priority under 35 U.S.C. § 119 to Korean Patent Application No. 10-2019-0131878, filed on Oct. 23, 2019, in the Korean Intellectual Property Office (KIPO), the contents of which are herein incorporated by reference in their entirety.

BACKGROUND

1. Field

Example embodiments relate to a wafer processing apparatus and a wafer processing method. More particularly, example embodiments relate to a wafer processing apparatus including a gas injector for supplying a process gas into a batch type reaction tube and a wafer processing method using the same.

2. Description of the Related Art

A plurality of vertically stacked wafers may be loaded into a batch reactor and then an atomic layer deposition (ALD) process may be performed to form a layer on the wafers. A gas injector may include a cylindrical gas nozzle which extends in a vertical direction within a batch type reaction chamber, and the cylindrical gas nozzle may spray a process gas on the vertically stacked waters. However, since the gas injector is installed fixedly within the reaction chamber, it may be difficult to accurately and sufficiently control a thickness distribution in the wafer in response to the wafer supported in a rotating boat.

SUMMARY

Example embodiments provide a wafer processing apparatus including a gas injector capable of providing a desired thickness distribution across a wafer.

Example embodiments provide a wafer processing method using the above wafer processing apparatus.

According to example embodiments, a wafer processing apparatus includes a reaction tube extending in a vertical direction, a door plate configured to load a boat into the reaction tube and positioned under the reaction tube to seal the reaction tube, the boat supporting a plurality of wafers thereon, a gas injector extending in the vertical direction along the boat within the reaction tube and including a plurality of ejection holes formed therein, a rotary mechanism configured to rotate the gas injector about its center axis to adjust an angle of the ejection holes with respect to the wafers, and a lift mechanism configured to move the gas injector upward and downward to adjust a height of the ejection holes relative to the wafers.

According to example embodiments, a wafer processing apparatus includes a reaction tube extending in a vertical direction, a door plate positioned under the reaction tube to seal the reaction tube, a gas introduction tube introducing a process gas from a gas supply source into the reaction tube, a gas injector extending from the gas introduction tube in the vertical direction along a boat within the reaction tube, and including a plurality of ejection holes formed therein, and a driving mechanism configured to rotate the gas injector about its center axis within a predetermined angle range and configured to move the gas injector upward and downward within a predetermined stroke range.

According to example embodiments, in a wafer processing method, a boat supporting a plurality of wafers therein is loaded into a reaction tube. A gas injector is arranged to extend within the reaction tube, the gas injector including a plurality of ejection holes formed therein. The gas injector is moved upward and downward to adjust a height of the ejection hole from the corresponding wafer. The gas injector may be rotated about its center axis to adjust an ejection angle of the ejection hole toward the wafer. A process gas may be supplied toward the wafers through the ejection holes of the gas injector.

According to example embodiments, a wafer processing apparatus may include a gas injector extending in a vertical direction within a reaction tube and including a plurality of ejection holes formed therein corresponding to wafers, and a driving mechanism configured to rotate the gas injector about its center axis within a predetermined angle range and configured to move the gas injector upward and downward within a predetermined stroke range.

The gas injector may be rotated to adjust an ejection angle of the ejection hole toward the wafer to thereby control precisely in-plane distribution of a thickness of a layer deposited on the wafer. Further, the gas injector may be moved upward and downward to adjust a height of the ejection hole on the corresponding wafer to thereby control more precisely in-plane distribution of the thickness of the layer deposited on the wafer. Thus, a deposition layer having uniform thickness may be formed on the wafer.

BRIEF DESCRIPTION OF THE DRAWINGS

Example embodiments will be more clearly understood from the following detailed description taken in conjunction with the accompanying drawings. FIGS. 1 to 8 represent non-limiting, example embodiments as described herein.

FIG. 1 is a longitudinal section view illustrating a wafer processing apparatus in accordance with example embodiments.

FIG. 3 is a longitudinal section view illustrating upward and downward movements of the gas injector of the wafer processing apparatus in FIG. 1.

FIG. 5 is a perspective view illustrating a portion of a coupling shaft of the driving mechanism in FIG. 4.

FIG. 8 is a flow chart illustrating a method of processing a wafer in accordance with example embodiments.

DETAILED DESCRIPTION OF EXAMPLE EMBODIMENTS

Figure 1:
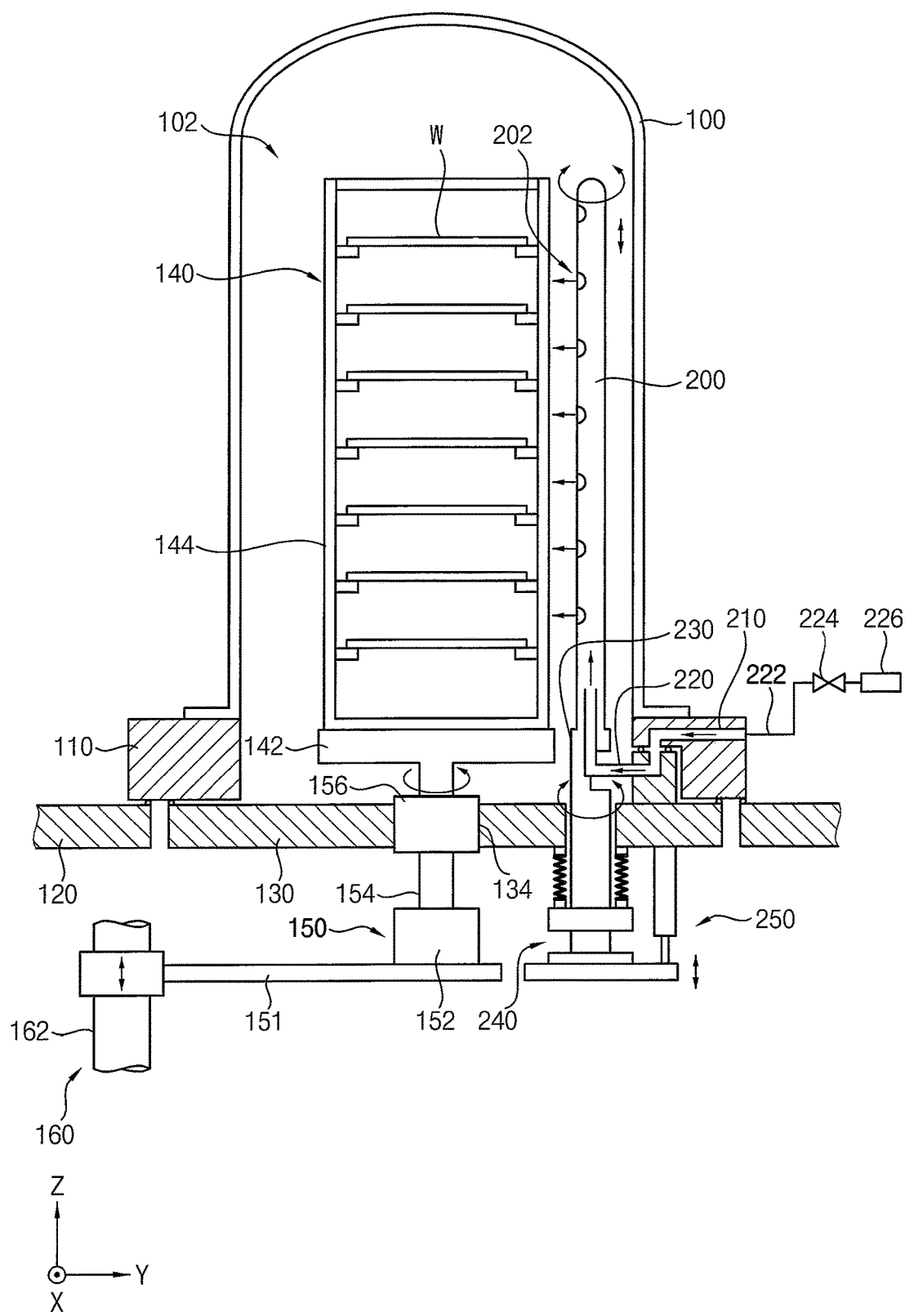

Hereinafter, example embodiments will be explained in detail with reference to the accompanying drawings. In the drawings, like numbers refer to like elements throughout.

Figure 2A:
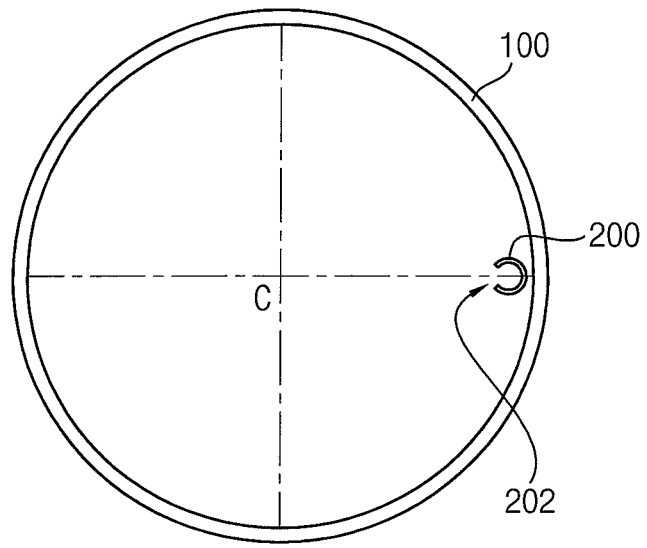
FIGS. 2A to 2C are transverse cross-sectional views illustrating rotational movements of a gas injector of the wafer processing apparatus in FIG. 1.
Figure 2B:
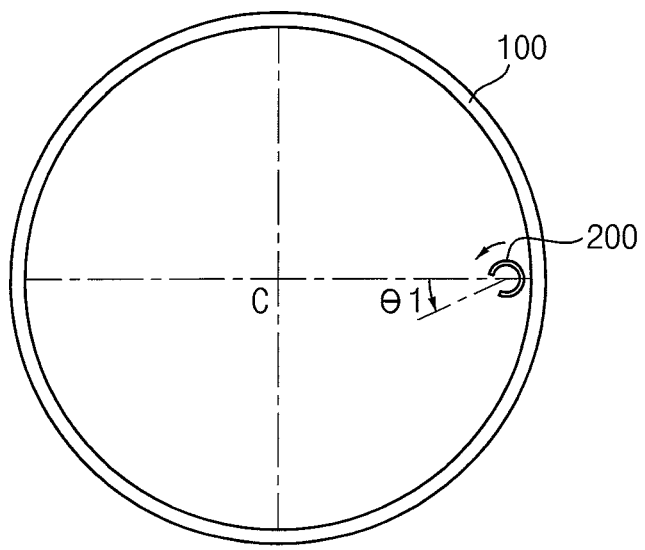
Figure 2C:
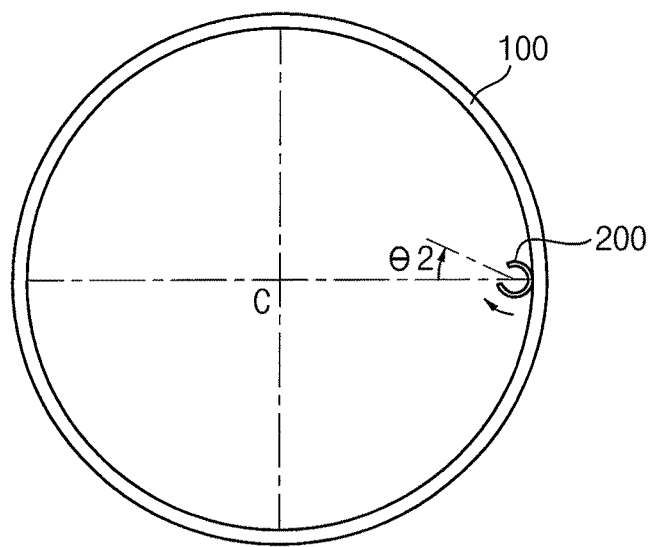
Figure 3:
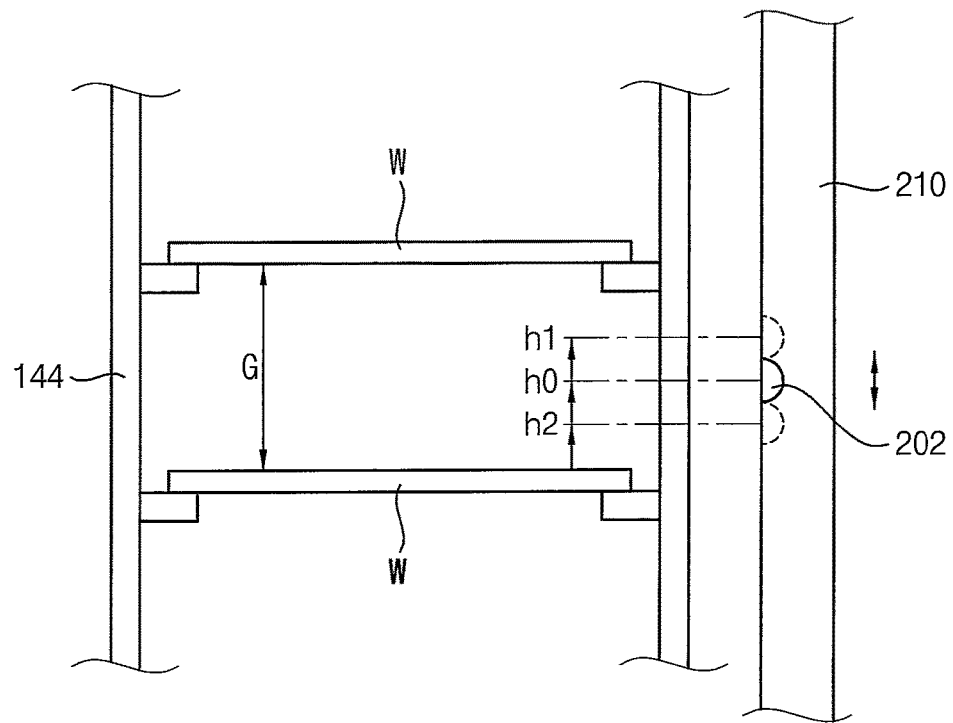
Figure 4A:
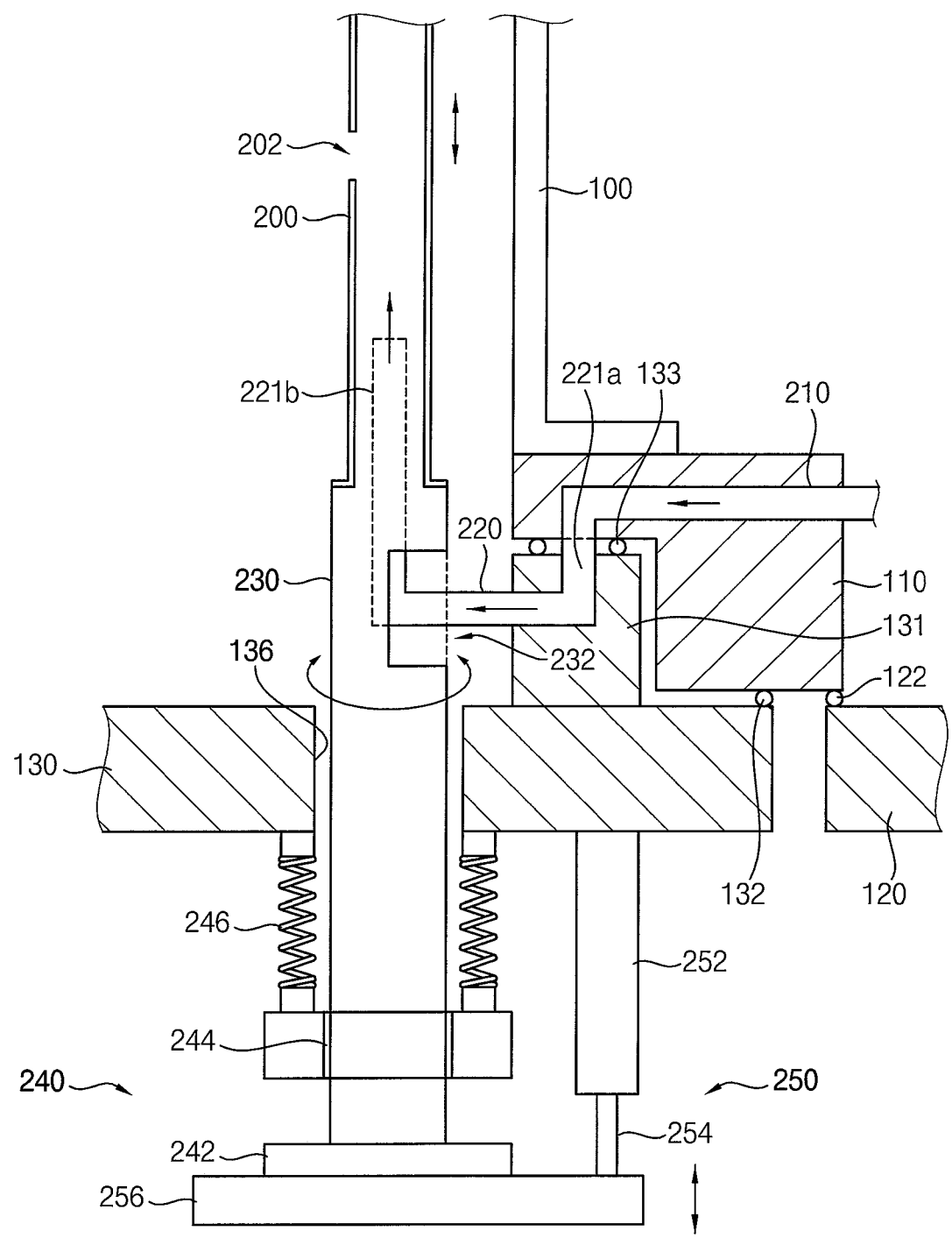
FIG. 4A is a longitudinal section view illustrating a driving mechanism for driving the gas injector of the wafer processing apparatus in FIG. 1.
Figure 4B:
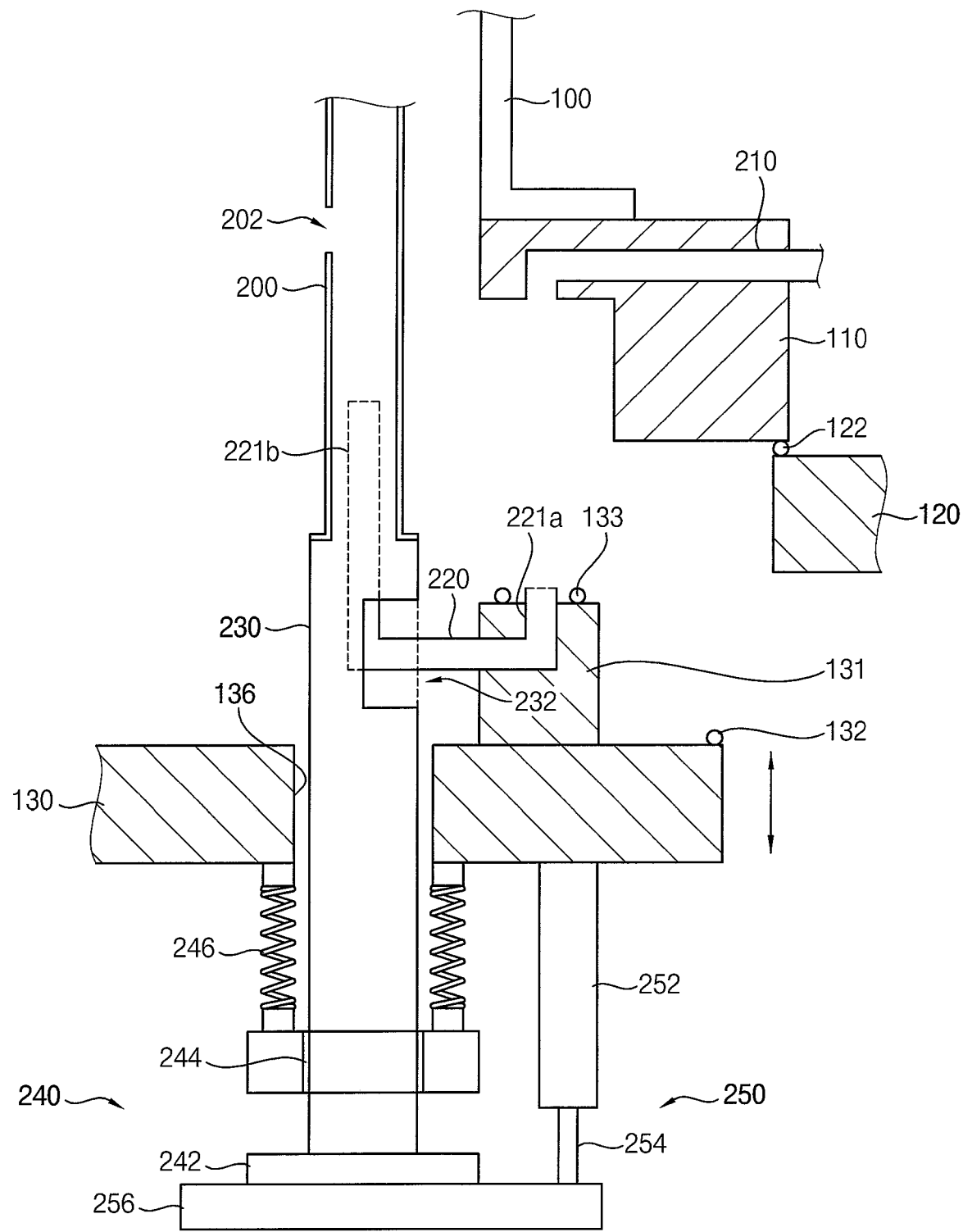
FIG. 4B is a longitudinal section view illustrating a door plate in FIG. 4A, wherein the door plate is moved downward to be separated from a flange.
Figure 5:
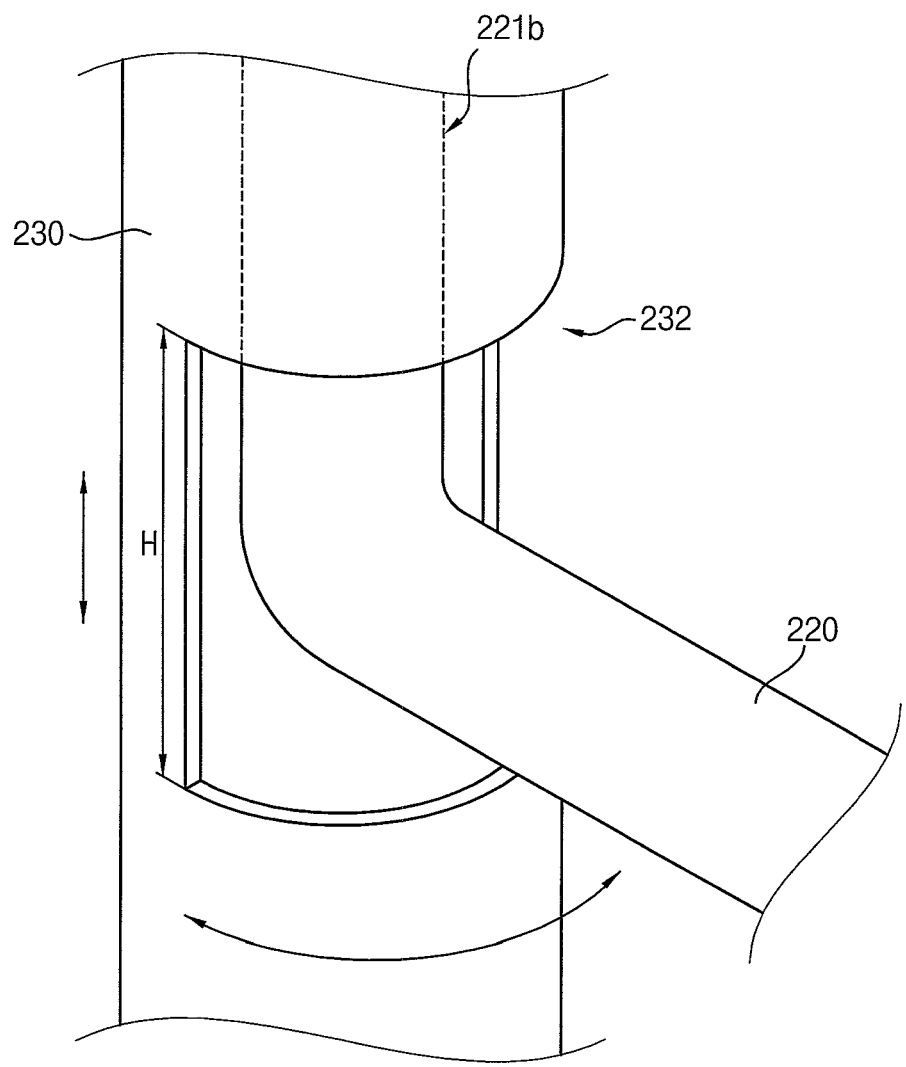
Figure 6A:
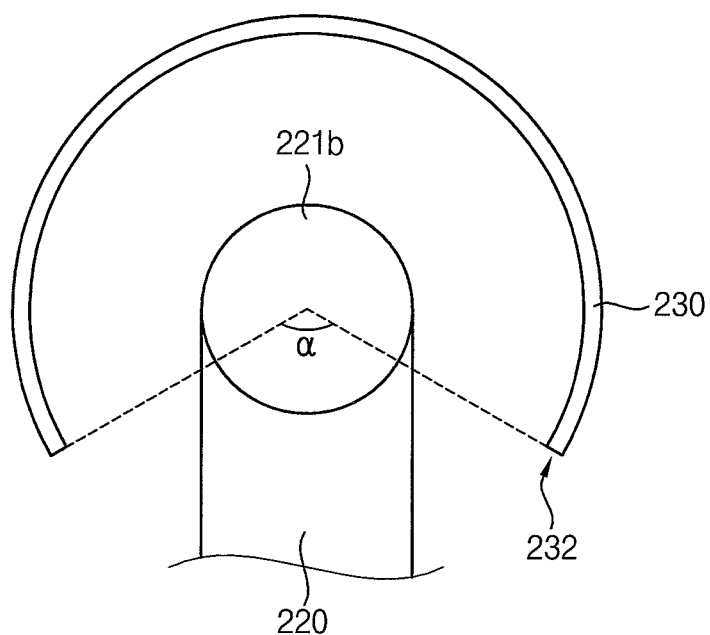
FIGS. 6A to 6C are transverse cross-sectional views illustrating rotational movements of the coupling shaft in FIG. 5.
Figure 6B:
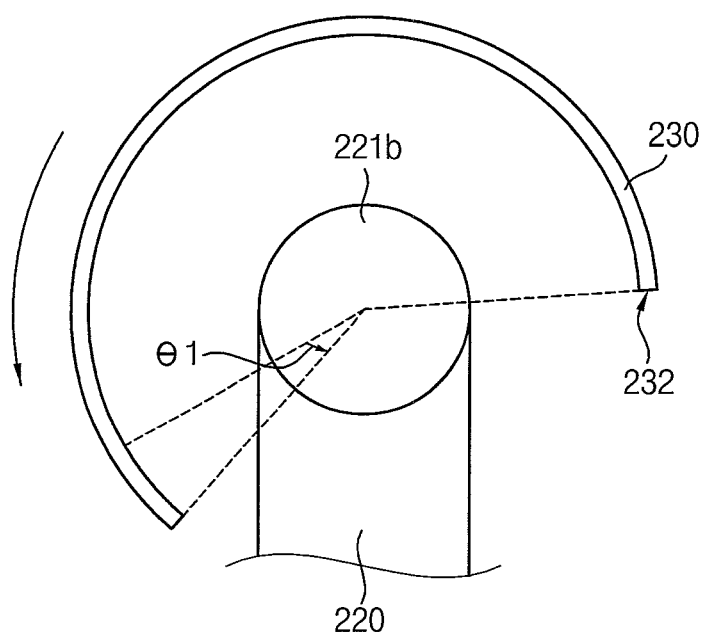
Figure 6C:
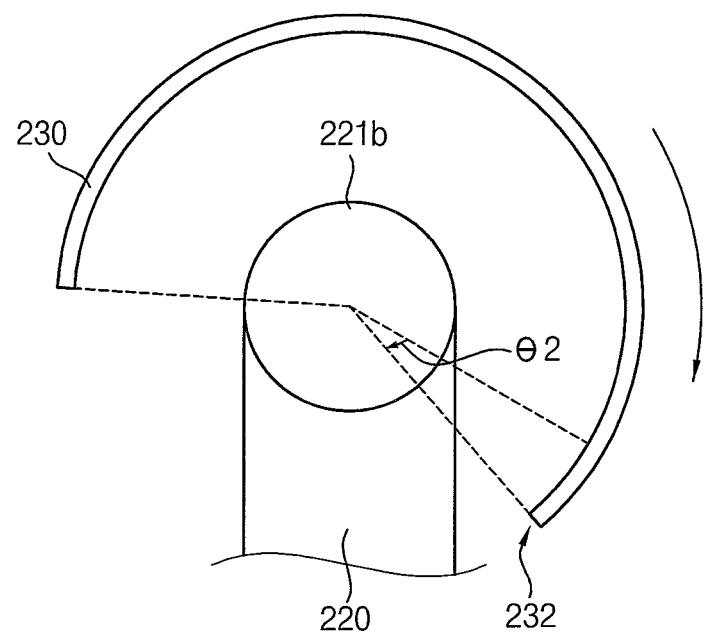
Figure 7A:
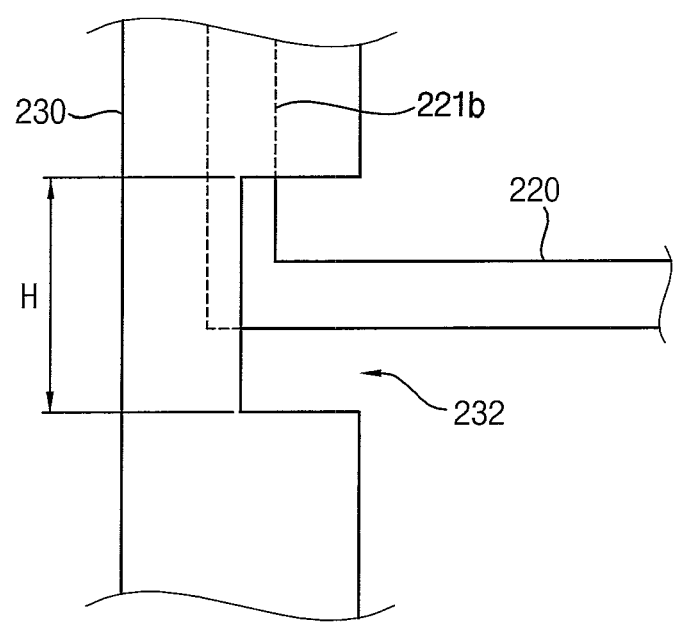
FIGS. 7A to 7C are longitudinal section views illustrating upward and downward movements of the coupling shaft in FIG. 5.
Figure 7B:
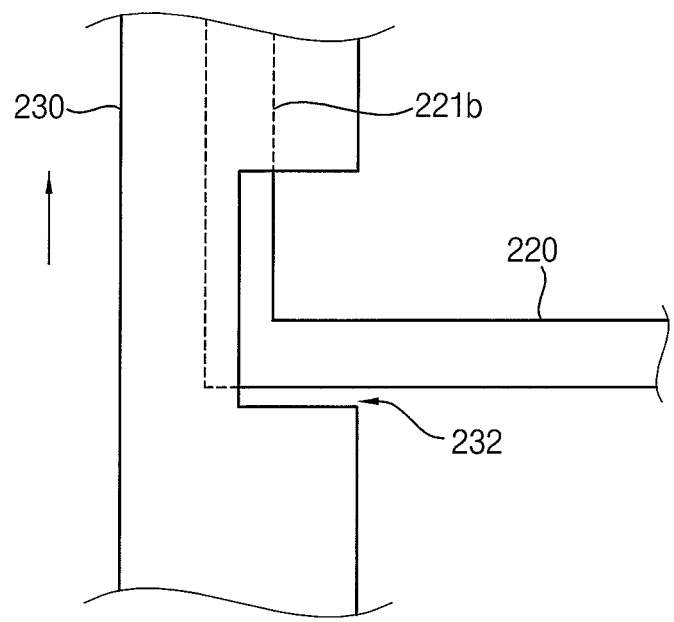
Figure 7C:
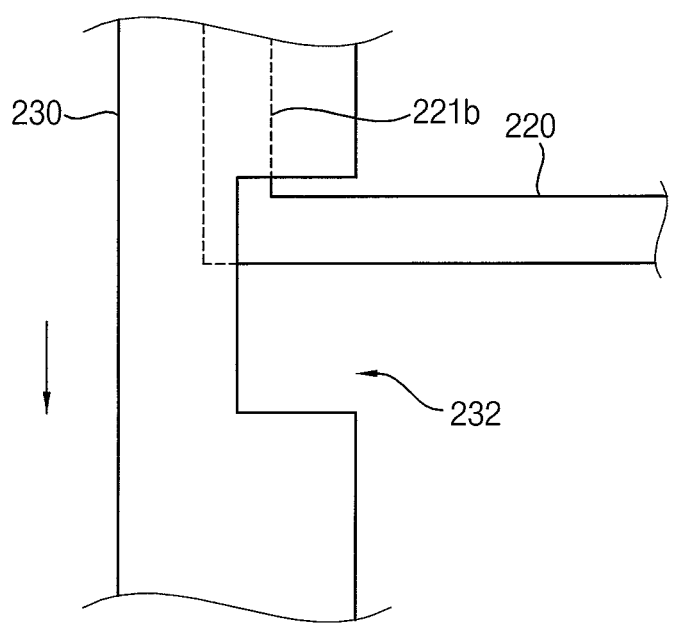

FIG. 1 is a longitudinal section view illustrating a wafer processing apparatus in accordance with example embodiments. FIGS. 2A to 2C are transverse cross-sectional views illustrating rotational movements of a gas injector of the wafer processing apparatus in FIG. 1. FIG. 3 is a longitudinal section view illustrating upward and downward movements of the gas injector of the wafer processing apparatus in FIG. 1. FIG. 4A is a longitudinal section view illustrating a driving mechanism for driving the gas injector of the wafer processing apparatus in FIG. 1. FIG. 4B is a longitudinal section view illustrating a door plate in FIG. 4A, wherein the door plate is moved downward to be separated from a flange. FIG. 5 is a perspective view illustrating a portion of a coupling shaft of the driving mechanism in FIG. 4. FIGS. 6A to 6C are transverse cross-sectional views illustrating rotational movements of the coupling shaft in FIG. 5. FIGS. 7A to 7C are longitudinal section views illustrating upward and downward movements of the coupling shaft in FIG. 5.

Referring to FIGS. 1 to 7C, a wafer processing apparatus 10 may include a reaction tube 100 extending in a vertical direction, a door plate 130 configured to load and unload a boat 140 which supports a plurality of wafers W into and from the reaction tube 100, a gas injector 200 configured to spray a reaction gas on the wafers W in the reaction tube 100, and a driving mechanism configured to rotate the gas injector 200 about its center axis and move the gas injector 200 upward and downward. Additionally, the wafer processing apparatus 10 may further include a gas supply portion configured to supply the process gas, an exhaust gas portion, etc.

In example embodiments, the wafer processing apparatus 10 may include a vertical batch reactor. The reaction tube 100 may have a cylindrical shape with an open lower end. The reaction tube 100 may extend in the vertical direction (Z direction) to define a reaction chamber 102. The vertical batch reactor may receive the boat 150 that holds a plurality of the wafers W therein. For example, a plurality of wafers W may be loaded on the boat 150, and the loaded boat 150 may be placed in the reaction chamber 102. The batch reactor may have benefits for efficient heating and loading sequences.

A lower portion of the reaction tube 100 may include an open end, and an upper portion of the reaction tube 100 may include a closed end. For example, the reaction tube 100 may have a cylindrical shape, with the lower portion being open and the upper portion being closed and having a rounded shape. Although it is not illustrated in the figures, the reaction chamber 102 may be maintained at a desired temperature by a temperature control system such as a heater (not illustrated) that surrounds the reaction tube 100.

The open lower end of the reaction tube 100 may be installed on a flange 110. For example, the flange 110 may be combined with the lower end of the reaction tube 100 by a sealing member such as an O-ring to seal the reaction tube 100. For example, the lower end of the reaction tube 100 may have a horizontal portion that extends perpendicular to the vertical sidewall of the reaction tube 100, and the horizontal portion may be disposed adjacent to the top surface of the flange 110 with a sealing member provided between the horizontal portions and the flange 110.

The reaction chamber 102 may receive the boat 140 that holds a plurality of the wafers W that are supported therein to be spaced apart in the vertical direction. The boat 140 may be supported on the door plate 130. The door plate 130 may move upward and downward to load and unload the boat 140 into and from the reaction tube 100. The lower end of the reaction tube 100 may be opened and closed by the door plate 130. For example, at least 25 to 150 wafers W may be stacked in the boat 140.

The door plate 130 may be positioned under the reaction tube 100 to seal the reaction tube 100. The door plate 130 may be combined with the flange 110 under the reaction tube 100 by a sealing member 132 such as an O-ring to seal the reaction tube 100.

A first through hole 134 may be formed in a middle region of the door plate 130. A table 142 supporting the boat 140 may be supported by an upper portion of a rotational shaft 154 extending through the first through hole 134. A magnetic fluid seal 156 may be installed in the first through hole 134 to support the rotational shaft 154 to be rotatable in a hermetically sealed state.

The rotational shaft 154 may be connected to a driving shaft of a driving motor 152. Accordingly, the boat 140 on the door plate 130 may be supported rotatably within the reaction tube 100. While the boat 140 is rotated at a desired speed, reaction gases may be introduced on the wafers W to perform a deposition process. Additionally, the driving motor 152 may be provided to be movable upward and downward by an arm 151, which is supported by an elevation mechanism 160 that is lifted and lowered along an elevation rod 162.

A peripheral portion of the flange 110 on which the lower end of the reaction tube 100 is installed may be supported by a base plate 120. The base plate 120 may be combined with the flange 110 by a sealing member 122 such as an O-ring. The base plate 120 may include a metal material such as stainless steel. A wafer transfer chamber may be provided under the base plate 120. A wafer transfer mechanism (not illustrated) may be provided in the wafer transfer chamber to transfer the wafers onto the boat 140 on the lowered door plate 130. The wafer transfer chamber may be in a nitrogen gas atmosphere of substantially atmospheric pressure. In addition, an upper side of the base plate 120 may be in an atmosphere of clean air in a clean room.

A controller (not illustrated) may control the entire wafer processing apparatus 10. The controller may control operations of various devices inside the substrate processing apparatus so that processing is performed under various processing conditions indicated in a recipe. In addition, the controller may receive signals from various sensors provided in the substrate processing apparatus, thereby ascertaining the position of the wafer W and performing sequence control for advancing a corresponding process. Further, the controller may ascertain the state of the substrate processing by receiving physical measurement values and the like, detected by various detectors provided in the substrate processing apparatus, and may perform feedback control necessary for appropriately performing substrate processing or the like.

The controller may include a calculation means and a storage means such as a Central Processing Unit (CPU), a Read-Only Memory (ROM), a Random Access Memory (RAM), or the like. The controller may be configured as a microcomputer that installs a program for processing a recipe from a storage medium in which the program is stored and executes recipe processing. Although not illustrated, the controller can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the processing controller 1020 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the controller can include a power source that provides an appropriate alternating current (AC) or direct current (DC) to power one or more components of the controller, and a bus that allows communication among the various disclosed components of the controller. As is understood, "software" refers to prescribed rules to operate a computer, such as code or script.

In example embodiments, the gas injector 200 may be installed in the reaction tube 100 to supply a reaction gas onto the wafers W. The gas injector 200 may include ejection holes 202 for spraying the process gas. The process gas may be ejected through the ejection holes 202 towards the center C of the reaction tube 100 in a horizontal plane (XY direction) parallel with principal surfaces of the wafers W. The ejection holes 202 may be arranged to be spaced apart from each other in the extending direction (Z direction) of the gas injector 200 corresponding to the wafers W respectively. In some embodiments, the distance between each adjacent set of ejections holes 202 may be the same. One or more gas injectors 200 may be provided.

In particular, the gas supply portion may include a gas introduction tube 220 for introducing the process gas into the reaction tube 100 from a gas supply source (not shown). The gas introduction tube 220 may extend from the flange 110 into the reaction tube 100. When the door plate 130 is lifted to be combined with the flange 110, the gas introduction tube 220 may be connected to a gas supply tube 210 which penetrates through the flange 110, to thereby serve as an inlet through which the process gas is injected into the reaction chamber from the gas supply source. The gas supply source may supply a source gas for an atomic layer deposition (ALD) process. For example, the gas supply source may supply the source gas for deposition of a silicon oxide layer, silicon nitride layer, etc.

An inlet of the gas supply tube 210 penetrating through the flange 110 may be connected to a gas line 222, and an opening/closing valve 224 and a flow controller 226 may be installed sequentially in the gas line 222. Thus, the process gas from the gas supply source may be supplied to the gas supply tube 210 through the flow controller 226, the opening/closing valve 224 and the gas line 222.

A support block 131 for supporting the gas introduction tube 220 may be provided on a peripheral region of the door plate 130. Since the support block 131 extends upwardly from an upper surface of the door plate 130, when the door plate 130 is lifted to be combined with the flange 110, the support block 131 may be combined with a lower surface of an inner protruding portion of the flange 110. The support block 131 may be combined with the inner protruding portion of the flange 110 by a sealing member 133 such as an O-ring to seal the reaction tube 100.

The gas introduction tube 220 may be provided to penetrate through the support block 131 and may be supported by the support block 131. An inlet portion 221a of the gas introduction tube 220 may penetrate through the support block 131 and may extend toward the lower surface of the inner protruding portion of the flange 110 in the vertical direction (Z direction) to be connected to the gas supply tube 210.

The gas introduction tube 220 may extend in the horizontal direction (XY direction) parallel with the upper surface of the door plate 130 from the flange 110. The gas introduction tube 220 may extend toward the center of the reaction tube 100 from the support block 131, and an outlet portion 221b of the gas introduction tube 220 may extend into the inside space of the gas injector 200 in the vertical direction (Z direction), to thereby supply the process gas into the gas injector 200.

In example embodiments, the gas injector 200 may be connected to the driving mechanism as described later such that the gas injector 200 is installed to be rotatable within a predetermined angle range about its center axis and to be movable upwardly and downwardly.

As illustrated in FIGS. 2A to 2C, the gas injector 200 may be rotated by a first angle Θ1 counterclockwise from an origin position where the ejection hole 202 faces toward the center C of the reaction tube 100 and may be rotated by a second angle Θ2 clockwise from the middle position. While spraying the gas in the horizontal direction through the ejection hole 202 of the gas injector 200, the gas injector 200 may be rotated to thereby control in-plane distribution of a thickness of a layer deposited on the wafer W. By rotating the gas injector 200, and angle of the ejection holes 202 with respect to the wafers may be adjusted.

For example, each of the first angle Θ1 and the second angle Θ2 may be 45 degrees. In this case, a rotational angle of the gas injector 200 may be 90 degrees. The rotational angle of the gas injector 200 may range from 3 degrees to 90 degrees. In example embodiments, the gas injector 200 may have a rotational speed of about 0.1 rpm to about 100 rpm.

As illustrated in FIG. 3, the gas injector 200 may be movable upward and downward by a predetermined stroke to change a height (h0, h1, h2) of the ejection hole 202 from the surface of the wafer W. For example, the gas injector 200 may be movable from height h0 to height h1 (and vice versa), movable from height h0 to height h2 (and vice versa or movable from height h1 to height h2 (and vice versa). By moving the gas injector 200 upward and downward, a height of the ejection holes 202 may be adjusted relative to the top surface of the wafers W. The amount of the predetermined stroke range of the gas injector 200 may be within a distance G between the adjacent wafers W. In some embodiments, the amount of the predetermined stroke range of the gas injector 200 may be in a range of about 1 mm to about 15 mm. For example, the distance from height h0 to height h1 may be in the range of about 1 mm to about 15 mm, and the distance from height h0 to height h2 may be in the range of about 1 mm to about 15 mm.

Accordingly, the height of the ejection hole 202 from the surface of the wafer W may be adjusted to supply a desired sufficient gas onto the corresponding wafer W, to thereby control the in-plane distribution of the thickness of the layer deposited on the wafer W.

Hereinafter, the driving mechanism for rotating and elevating the gas injector will be explained.

As illustrated in FIG. 4A, the driving mechanism may be installed in the door plate 130 to rotate the gas injector 200 about its center axis and lift and lower the gas injector 200 upward and downward. The driving mechanism may include a rotary mechanism 240 for rotating the gas injector 200 within the predetermined angle range about its center axis and a lift mechanism 250 for moving the gas injector 200 upward and downward within the predetermined stroke range.

In particular, the driving mechanism may include a coupling shaft 230 which supports the gas injector 200. A lower end portion of the gas injector 200 may be combined with and supported by an upper end portion of the coupling shaft 230. As the coupling shaft 230 is rotated by the rotary mechanism 240, the gas injector 200 may be rotated together with the coupling shaft 230. As the coupling shaft 230 is moved upward and downward by the lift mechanism 250, the gas injector 200 may be moved upward and downward together with the coupling shaft 230.

A second through hole 136 may be formed in the peripheral region of the door plate 130 adjacent to the flange 110. The coupling shaft 230 may be inserted into and penetrate through the second through hole 136. The coupling shaft 230 may be spaced apart from an inner wall of the second through hole 136. Thus, the coupling shaft 230 may penetrate through the door plate 130 to extend in the vertical direction (Z direction) within the reaction tube 100.

A magnetic fluid seal 244 may be installed under the door plate 130 to support the coupling shaft 230 to be rotatable in a hermetically sealed state. Additionally, a bellows 246 may be attached between a lower support block including the magnetic fluid seal 244 and a lower surface of the door plate 130. The magnetic fluid seal 244 and the bellows 246 may allow free rotational movement and vertical movement of the coupling shaft 230 and may airtightly seal the reaction tube 100 from the outside.

The rotary mechanism 240 may include a rotary motor 242 as a driving source for rotating the coupling shaft 230. The coupling shaft 230 may be connected to the rotary motor 242 via the magnetic fluid seal 244. Thus, the coupling shaft 230 may be rotated within the predetermined angle range by the rotary motor 242.

The lift mechanism 250 may include an actuator for elevating and lowering the coupling shaft 230. The lower support block supporting the coupling shaft 230 and the rotary motor 242 may be supported on an elevation plate 256. The elevation plate 256 may be provided to be movable upward and downward by a cylinder rod 254 of a driving cylinder 252 as the actuator. Accordingly, the coupling shaft 230 may be moved upward and downward within the predetermined stroke range by the driving cylinder 252.

As illustrated in FIG. 4B, the door plate 130 may be lifted and lowered to be combined selectively with the flange 110. When the door plate 130 is moved downward to be separated from the flange 110, the inlet portion 221a of the gas introduction tube 220 penetrating through the support block 131 may be exposed to the outside. When the door plate 130 is moved upward to be combined with the flange 110, the support block 131 may be combined with the inner protruding portion of the flange 110 and the inlet portion 221a of the gas introduction tube 220 may be connected to the gas supply tube 210 penetrating through the flange 110.

As illustrated in FIG. 5, a slit 232 may be formed in an upper portion of the coupling shaft 230 to receive the outlet portion 221b of the gas introduction tube 220 of the gas introduction tube 220. The gas introduction tube 220 may extend into the inside space of the coupling shaft 230 through the slit 232 and the outlet portion 221b of the gas introduction tube 220 may extend in the vertical direction from the inside space of the coupling shaft 230 to the inside space of the gas injector 200.

As illustrated in FIGS. 6A to 6C, the slit 232 may extend in a circumferential direction to have a central angle α at the center of the coupling shaft 230 so as to avoid collision with the gas introduction tube 220 when the coupling shaft 230 rotates within the predetermined angle range (Θ1, Θ2) and the gas introduction tube 220 is maintained in a fixed position. For example, central angle α may be large enough to allow the coupling shaft 230 to rotate in the amount of the first angle θ1 and the second angle θ2, without allowing the coupling shaft 230 to contact the gas introduction tube 220.

As illustrated in FIGS. 7A to 7C, the slit 232 may extend in the extending direction of the coupling shaft 230 to have a predetermined height H so as to avoid collision with the gas introduction tube 220 when the coupling shaft 230 moves upward and downward within the predetermined stroke and the gas introduction tube 220 is maintained in a fixed position. For example, the height H may be large enough to allow the coupling shaft 230 to move up and down in the range of height h2 to height h1, without allowing the coupling shaft 230 to contact the gas introduction tube 220.

Although the driving mechanism installed in the door plate 130 is exemplarily illustrated, it may not be limited thereto, and it may be understood that the driving mechanism is installed in the flange 110 or in both of the door plate 130 and the flange 110.

In example embodiments, the wafer processing apparatus 10 may include at least one gas nozzle (not illustrated) for cleaning the reaction chamber 102. The gas nozzle may supply a cleaning gas and/or a purge gas. For example, the wafer processing apparatus 10 may include a first gas nozzle for supplying the cleaning gas and a second gas nozzle for supplying the purge gas.

In example embodiments, the exhaust portion may include an exhaust port (not illustrated) which is installed in the flange 110 to be connected to the reaction chamber 102. The exhaust port may be connected to a vacuum exhaust system which exhausts an atmosphere in the reaction chamber 102. The gas in the reaction chamber 102 may flow out of the reaction tube 100 via the exhaust port.

Hereinafter, a method of processing a plurality of wafers using the wafer processing apparatus in FIG. 1 will be explained.

FIG. 8 is a flow chart illustrating a method of processing a wafer in accordance with example embodiments.

Referring to FIGS. 1 to 4 and 8, a plurality of wafers W may be loaded onto a boat 104, and the boat 104 may be loaded into a reaction chamber 102 of a wafer processing apparatus 10 (S100).

A reaction tube 100 of the wafer processing apparatus 10 may extend in a vertical direction to define the reaction chamber 102. A wafer transfer chamber may be disposed under the reaction chamber 102 e.g., under a base plate 120. After the wafers W are loaded into a boat 140, the boat 140 may be lifted and loaded into the reaction chamber 102 by an elevation mechanism 160.

Then, a gas injector 200 may be arranged within the reaction tube 100 (S110), and the gas injector 200 may be moved upward and downward within a predetermined stroke range to adjust heights of the ejection holes 202 from corresponding wafers W (S120).

The gas injector 200 may be combined with and supported by a coupling shaft 230 which is installed in a door plate 130, and thus, the gas injector 200 may be rotated and moved upward and downward together with the coupling shaft 230.

As the door plate 130 is lifted, the gas injector 200 may be arranged within the reaction tube 100, and the coupling shaft 230 may be moved upward by the predetermined stroke by a driving cylinder 252 of a lift mechanism 250.

Thus, the gas injector 200 may be raised such that each of the ejection holes 202 has a desired height (e.g., height h0, height h1, or height h2) above the corresponding wafer W in order to supply a desired sufficient amount of a gas onto the corresponding wafer W.

Then, the gas injector 200 may be rotated within a predetermined angle range to adjust an ejection angle of the ejection hole 202 toward the wafer W (S130), and then, a process gas may be supplied toward the waters (W) through the ejection holes 202 of the gas injector 200 installed within the reaction tube 100, respectively to deposit a layer on each of the wafers W (S140).

The coupling shaft 230 may be rotated within the predetermined angle range about its center axis by a rotary motor 242 of a rotary mechanism 240. Thus, the ejection angle of the ejection hole 202 of the gas injector 200 may be adjusted to thereby obtain a desired thickness distribution across the corresponding wafer W.

For example, the step of rotating the gas injector 200 may be performed during the step of supplying the process gas into the reaction tube 100 through the ejection holes 202 of the gas injector 200. Alternatively, the step of rotating the gas injector 200 may be performed before the step of supplying the process gas.

The process gas may be ejected on the wafers W through a plurality of the ejection holes 202 of the gas injector 200. For example, the process gas may include a source gas for forming a blocking layer, a charge storage layer and a tunnel insulation layer of a cell transistor of VNAND. Additionally, a pulse gas or a cleaning gas may be supplied into the reaction chamber 102. Accordingly, an ALD process may be performed to form an insulation layer such as silicon oxide or silicon nitride layer on each of the wafers W.

Then, a gas may be exhausted from the reaction chamber 102 (S150), and the boat 140 may be unloaded (S160).

The gas in the reaction chamber 102 may be exhausted from the reaction tube 100 through an exhaust port that is formed in a flange 110.

After forming the layer having a desired thickness on the wafers W, the wafers W may be unloaded from the reaction chamber 102.

The above wafer processing apparatus and water processing method may be used to manufacture semiconductor devices including logic devices and memory devices, and further processes may be performed on the wafer, for example to form the semiconductor device. For example, additional conductive and insulating layers may be deposited on the wafer to form semiconductor chips, the semiconductor chips may then be singulated, packaged on a package substrate, and encapsulated by an encapsulant to form a semiconductor package. The semiconductor device may be applied to various systems such as a computing system. The semiconductor device may include finFET, DRAM, VNAND, etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A wafer processing apparatus, comprising:
a reaction tube extending in a vertical direction;
a door plate configured to load a boat into the reaction tube and positioned under the reaction tube to seal the reaction tube, the boat supporting a plurality of wafers thereon;
a gas injector extending in the vertical direction along the boat within the reaction tube, and including a plurality of ejection holes formed therein;
a coupling shaft combined with a lower portion of the gas injector to support the gas injector:
a rotary motor configured to rotate the gas injector about its center axis to adjust an angle of the ejection holes with respect to the wafers; and
an actuator configured to move the gas injector upward and downward to adjust a height of the ejection holes relative to the wafers,
wherein the coupling shaft is inserted into and penetrates through a through hole formed in the door plate,
wherein the rotary motor rotates the coupling shaft, and
wherein the actuator elevates and lowers the coupling shaft.

2. The wafer processing apparatus of claim 1, wherein the ejection holes are spaced apart from each other along an extending direction of the gas injector to be in one-to-one correspondence with the wafers.

3. The wafer processing apparatus of claim 1, wherein the gas injector is movable upward and downward within a predetermined stroke range.

4. The wafer processing apparatus of claim 3, wherein an amount of the predetermined stroke range of the gas injector is in a range of about 1 mm to about 15 mm.

5. The wafer processing apparatus of claim 1, wherein the gas injector is rotatable within a predetermined angle range about its center axis.

6. The wafer processing apparatus of claim 5, wherein the predetermined angle range of the gas injector ranges from 3 degrees to 90 degrees.

7. The wafer processing apparatus of claim 1,
wherein the coupling shaft is spaced apart from an inner wall of the through hole.

8. The wafer processing apparatus of claim 1, further comprising:
a gas introduction tube including an end portion extending into an inner space of the gas injector through a slit formed in the coupling shaft within the reaction tube.

9. A wafer processing apparatus, comprising:
a reaction tube extending in a vertical direction;
a door plate positioned under the reaction tube to seal the reaction tube;
a gas introduction tube introducing a process gas from a gas supply source into the reaction tube;
a gas injector extending from the gas introduction tube in the vertical direction along a boat within the reaction tube, and including a plurality of ejection holes formed therein;
a coupling shaft combined with a lower portion of the gas injector to support the gas injector;
a rotary motor configured to rotate the gas injector about its center axis within a predetermined angle range; and
an actuator configured to move the gas injector upward and downward within a predetermined stroke range,
wherein the coupling shaft is inserted into and penetrates through a through hole formed in the door plate,
wherein the rotary motor rotates the coupling shaft, and
wherein the actuator elevates and lowers the coupling shaft.

10. The wafer processing apparatus of claim 9,
  wherein the coupling shaft is spaced apart from an inner wall of the through hole.

11. The wafer processing apparatus of claim 9, wherein an end portion of the gas introduction tube extends into an inner space of the gas injector through a slit formed in the coupling shaft within the reaction tube.

12. The wafer processing apparatus of claim 11, wherein the slit extends in a circumferential direction to have a predetermined central angle at the center of the coupling shaft and extends in an extending direction of the coupling shaft to have a predetermined height.

13. The wafer processing apparatus of claim 9, further comprising:
  a magnetic fluid seal installed under the door plate to support the coupling shaft rotatable in a hermetically sealed state; and
  a bellows attached between a lower support block including the magnetic fluid seal and a lower surface of the door plate.

14. The wafer processing apparatus of claim 9, wherein the ejection holes are spaced apart from each other along an extending direction of the gas injector to be in one-to-one correspondence with wafers loaded onto the boat.

15. The wafer processing apparatus of claim 9,
  wherein the predetermined angle range of the gas injector ranges from 3 degrees to 90 degrees, and
  wherein an amount of the predetermined stroke range of the gas injector is in a range of about 1 mm to about 15 mm.

* * * * *